(12) United States Patent
Yamaguchi et al.

(10) Patent No.: US 7,554,141 B2
(45) Date of Patent: Jun. 30, 2009

(54) SOLID-STATE IMAGE PICKUP DEVICE AND METHOD OF MANUFACTURING THE SAME

(75) Inventors: Tetsuya Yamaguchi, Tokyo (JP);
Hiroshige Goto, Yokohama (JP);
Hirofumi Yamashita, Kawasaki (JP);
Hisanori Ihara, Yokohama (JP); Ikuko Inoue, Yokohama (JP); Nagataka Tanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 445 days.

(21) Appl. No.: 11/392,616

(22) Filed: Mar. 30, 2006

(65) Prior Publication Data

US 2006/0219867 A1    Oct. 5, 2006

(30) Foreign Application Priority Data

Mar. 31, 2005  (JP)  ............................. 2005-104896

(51) Int. Cl.
*H01L 31/00*  (2006.01)
*H01L 31/062* (2006.01)
*H01L 31/113* (2006.01)

(52) U.S. Cl. ...................................... 257/292; 257/446

(58) Field of Classification Search ......... 257/291–294, 257/431–448, E31.073, E31.127, E27.133
See application file for complete search history.

(56) References Cited

U.S. PATENT DOCUMENTS 6,521,920 B2 * 2/2003 Abe ........................... 257/223
6,677,627 B2    1/2004 Miida
6,825,516 B2   11/2004 Rhodes
7,154,137 B2 * 12/2006 Nozaki ........................ 257/292
7,307,300 B2 * 12/2007 Inoue .......................... 257/291
2004/0094784 A1  5/2004 Rhodes et al.

FOREIGN PATENT DOCUMENTS

JP    2001-160620    6/2001
JP    2001-223351    8/2001

* cited by examiner

*Primary Examiner*—Cuong Q Nguyen
(74) *Attorney, Agent, or Firm*—Oblon, Spivak, McClelland, Maier & Neustadt, P.C.

(57) ABSTRACT

A solid-state image pickup device comprising a semiconductor substrate which comprises a substrate body containing P-type impurities and a first N-type semiconductor layer containing N-type impurities, the first N-type semiconductor layer being provided on the substrate body, and including a first P-type semiconductor layer which contains p-type impurities, and which is located on the substrate body, a plurality of optical/electrical conversion portions formed of second N-type semiconductor layers which are provided independently of each other in respective positions in a surface portion of the first N-type semiconductor layer, and a plurality of second P-type semiconductor layers which are formed to surround the optical/electrical conversion portions, which are provided along element isolation regions provided in respective positions in the surface portion of the first N-type semiconductor layer, and which continuously extend from the surface portion of the first N-type semiconductor layer to a surface portion of the first P-type semiconductor layer.

17 Claims, 7 Drawing Sheets

SOLID-STATE IMAGE PICKUP DEVICE AND METHOD OF MANUFACTURING THE SAME

CROSS-REFERENCE TO RELATED APPLICATIONS

This application is based upon and claims the benefit of priority from prior Japanese Patent Application No. 2005-104896, filed Mar. 31, 2005, the entire contents of which are incorporated herein by reference.

BACKGROUND OF THE INVENTION

1. Field of the Invention

The present invention relates to a solid-state image pickup device and a method of manufacturing the same, and in particular a solid-state image pickup device in which elements of a substrate such as a well are improved in structure, to thereby improve the image quality, sensitivity and electrical characteristics of the solid-state image pickup device, and a method of manufacturing the same.

2. Description of the Related Art

In general, a so-called charge-coupled device (CCD) type of solid-state image pickup device (CCD image sensor) is well known as a solid-state image pickup device. Also, generally, the CCD image sensor is formed on an N-type substrate. The CCD image sensor needs three power supplies which are provided to have different voltage values, for driving the CCD image sensor. For example, it needs three power supplies having voltages of 5, 8 and 15 V as driving power supplies. The power consumption of such a CCD image sensor is approximately 500 mW.

Furthermore, in recent years, so-called CMOS type of amplification-type solid state image pickup devices (CMOS image sensors) have been proposed and commercialized as solid-state image pickup devices which differe in operation principle from the CCD image sensor. Such a CMOS image sensor has features different from those of the CCD image sensor. To be more specific, the CMOS image sensor has a single power supply, it can be driven with a low voltage, and the power consumption is low. For example, the CMOS image sensor has only to include a single 3V power supply. Also, the power consumption of the CMOS image sensor is approximately 50 mW.

However, recently, CMOS image sensors having a larger number of pixels (arranged at a higher density) have been manufactured. If the number of pixels is increased without changing the size of the sensor, the size of each pixel needs to be reduced. Then, the light receiving area of each photodiode also needs to be reduced. Consequently, the sensitivity of each photodiode is lowered.

On the other hand, the CMOS image sensor, as described above, is designed to be driven with a low voltage, and it is therefore difficult to widen the depletion layer of each photodiode, as compared with the CCD image sensor. Accordingly, with respect to the CMOS image sensor, it is difficult to adopt a method in which the depletion layer of the photodiode is widened to improve the sensitivity, thereby compensating for lowering of the sensitivity which is caused by further minutely forming the device. Thus, with respect to the CMOS image sensor, it is very important to develop a technique for improving the sensitivity in a method different from that in the CCD image sensor, in order that the pixels be arranged at a higher density. This is disclosed in, e.g., Jpn. Pat. Appln. KOKAI Publications No. 2001-160620 and No. 2001-223351. In addition, it has been also required to develop a technique which lowering of the image quality such as blooming or color crosstalk can be prevented, in addition to improvement of the sensitivity.

As a measure for solving the above problem, a technique for efficiently collecting electrons in photodiodes by using, e.g., an $N/P^+$ substrate, has been examined. The $N/P^+$ substrate has a structure in which an N-type semiconductor layer is deposited on a $P^+$ substrate serving as a substrate body by an epitaxial growth method. When N-type impurities such as phosphorus (P) are ion-implanted into the N-type epitaxial layer of the $N/P^+$ substrate by an accelerator to form a photodiode (N-type semiconductor layer), the depletion layer of the photodiode can be easily widened, as compared with a $P/P^+$ substrate. Therefore, the sensitivity of the CMOS image sensor can be improved without increasing the driving voltage of the CMOS image sensor. In addition, since the short life time of carriers can be utilized, lowering of the image quality such as blooming or color crosstalk can be prevented. Therefore, the above problem can be solved by manufacturing a CMOS image sensor by using an $N/P^+$ substrate.

However, unlike formation of a CMOS image sensor by using a $P/P^+$ substrate, that of a CMOS image sensor by using an $N/P^+$ substrate has some problems specific to the $N/P^+$ substrate. A first problem is related to isolation of a plurality of photodiodes. It should be noted that in a $P/P^+$ substrate, a photodiodes (N-type semiconductor layers) are formed in a P-type epitaxial layer, and thus they are isolated from each other by a P-type semiconductor layer of the P-type epitaxial layer; that is, the photodiodes are not electrically connected to each other. On the other hand, in the $N/P^+$ substrate, a plurality of photodiodes (N-type semiconductor layers) are formed in an N-type epitaxial layer, and thus they are not isolated from each other; that is, they are electrically connected to each other.

A second problem is related to leak current. In the $P/P^+$ substrate, in a dicing step in which a single Si wafer is cut into a plurality of semiconductor chips, P-type semiconductor layers appear at cut sections of the semiconductor chips. In the $N/P^+$ substrate, in the dicing step, PN junction surfaces, which correspond to interfaces between P-type substrate bodies and N-type epitaxial layers, appear at the cut sections of the semiconductor chips. If the PN junction surfaces appear at the sections of the chips, it is further highly possible that they may cause leakage of current at the sections, or the leak current may be increased.

BRIEF SUMMARY OF THE INVENTION

According to an aspect of the invention, there is provided a solid-state image pickup device comprising: a semiconductor substrate which comprises a substrate body containing P-type impurities and a first N-type semiconductor layer containing N-type impurities, the first N-type semiconductor layer being provided on the substrate body, and including a first P-type semiconductor layer which contains p-type impurities, and which is located on the substrate body; a plurality of optical/electrical conversion portions formed of second N-type semiconductor layers which are provided independently of each other in respective positions in a surface portion of the first N-type semiconductor layer; and a plurality of second P-type semiconductor layers which are formed to surround the optical/electrical conversion portions, which are provided along element isolation regions provided in respective positions in the surface portion of the first N-type semiconductor layer, and which continuously extend from the surface portion of the first N-type semiconductor layer to a surface portion of the first P-type semiconductor layer.

According to another aspect of the invention, there is provided a method of manufacturing a solid-state image pickup device, which comprises: forming a first P-type semiconductor layer by performing heat treatment on a semiconductor substrate which comprises (i) a substrate body containing P-type impurities, and (ii) a first N-type semiconductor layer containing N-type impurities and provided on the substrate body, to diffuse the P-type impurities into a portion of the first N-type semiconductor layer, which is located on the substrate body; forming a plurality of optical/electrical conversion portions by injecting N-type impurities into a plurality of portions of a surface portion of the first N-type semiconductor layer to form a plurality of second N-type semiconductor layers, respectively; and forming a plurality of second P-type semiconductor layers by continuously injecting P-type impurities thereinto until the second P-type semiconductor layer are formed to surround the optical/electrical conversion portions and along element isolation regions provided in respective positions of the surface portion of the first N-type semiconductor layer, and extend from the surface portion of the first N-type semiconductor layer to a surface portion of the first P-type semiconductor layer.

DETAILED DESCRIPTION OF THE INVENTION

Figure 6:
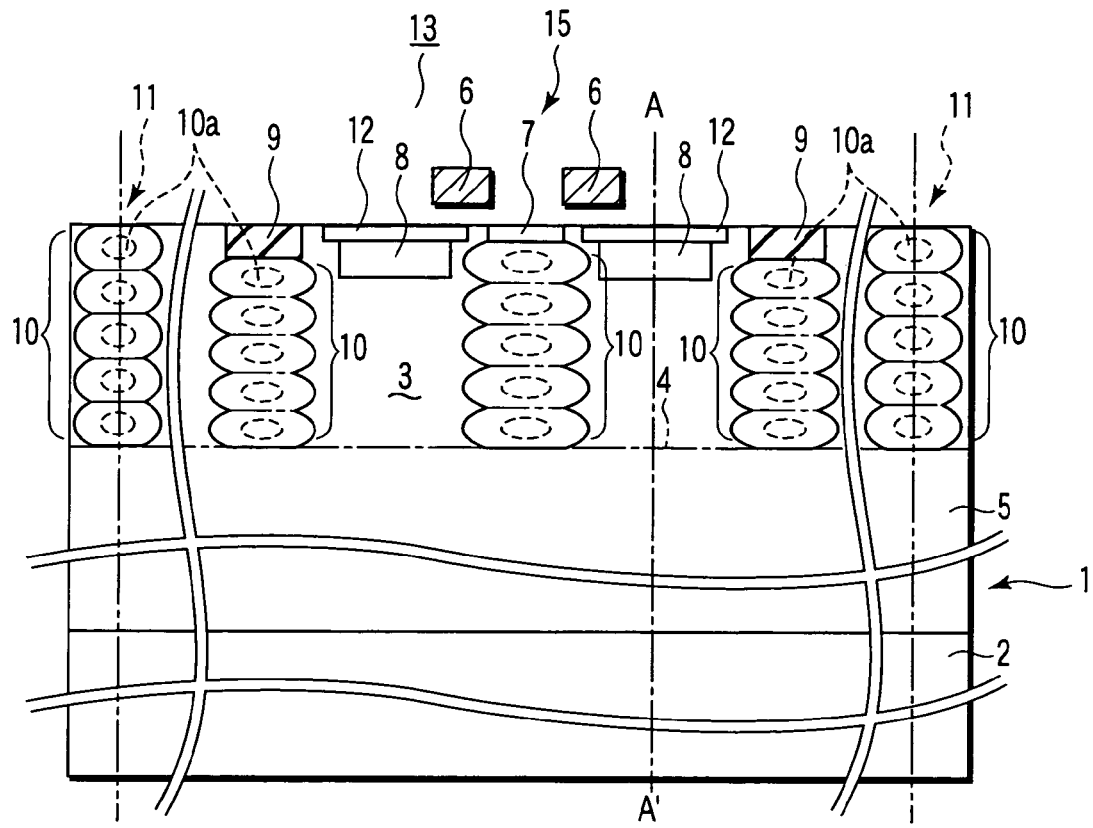
FIG. 6 is a vertical sectional view which shows the solid-state image pickup device according to the embodiment, and which is used in explaining the last manufacturing step for the solid-state image pickup device.
Figure 7:
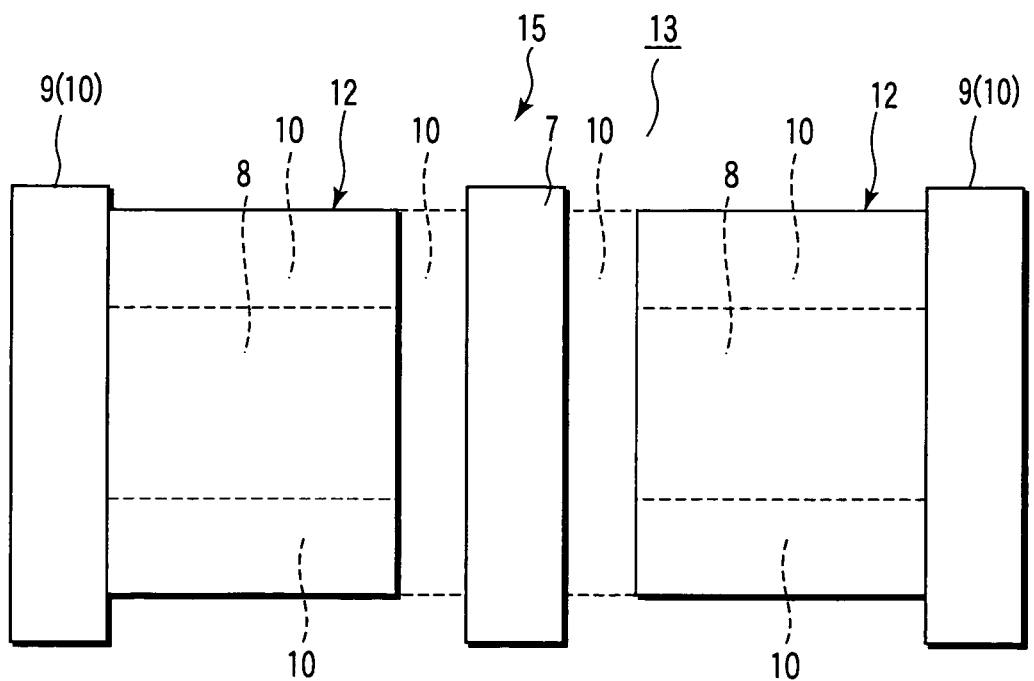
FIG. 7 is a plan view of the solid-state image pickup device shown in FIG. 6.
Figure 8:
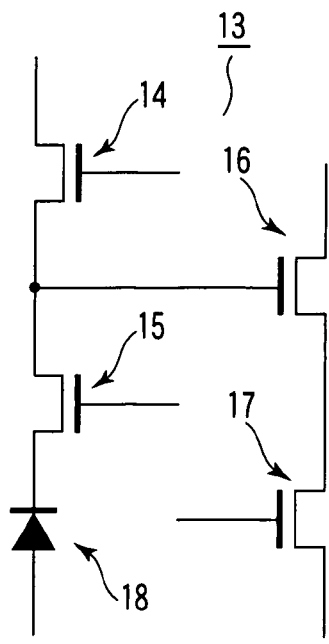
FIG. 8 is a simplified circuit diagram of a main potion of the solid-state image pickup device shown in FIG. 6.
Figure 9:
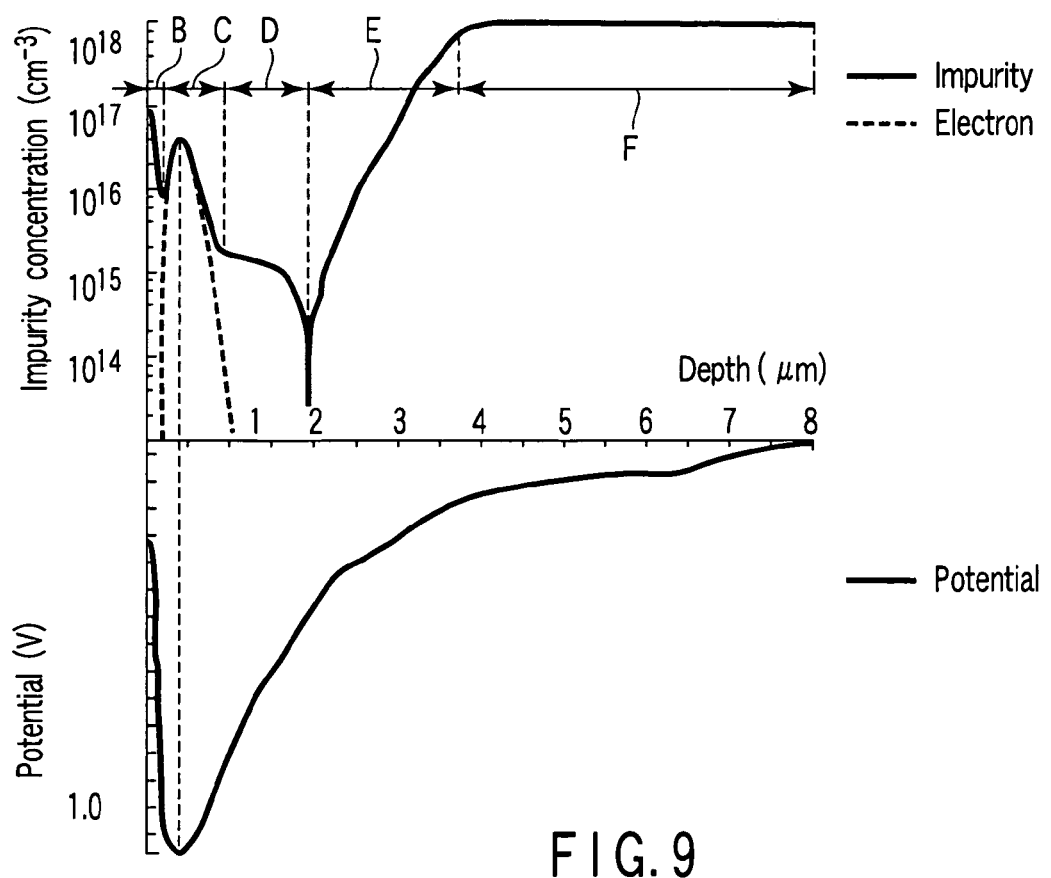
FIG. 9 is a graph showing the impurity concentration, the electron distribution and the potential with respect to part of the solid-state image pickup device which is taken along a one-dot-dash line A-A' in FIG. 6.

An embodiment of the present invention will be explained with reference to FIGS. 1 to 9. FIGS. 1 to 5 are vertical sectional views showing manufacturing steps for a solid-state image pickup device according to the embodiment of the present invention. FIG. 6 is a vertical sectional view showing the solid-state image pickup device according to the embodiment of the present invention and a manufacturing step therefor. FIG. 7 is a plan view of the solid-state image pickup device shown in FIG. 6. FIG. 8 is a simplified circuit diagram of a main portion of the solid-state image pickup device shown in FIG. 6. FIG. 9 is a graph showing the impurity concentration, the electron distribution and the potential with respect to part of the solid-state image pickup device which is taken along a one-dot-dash line A-A' in FIG. 6.

Figure 1:
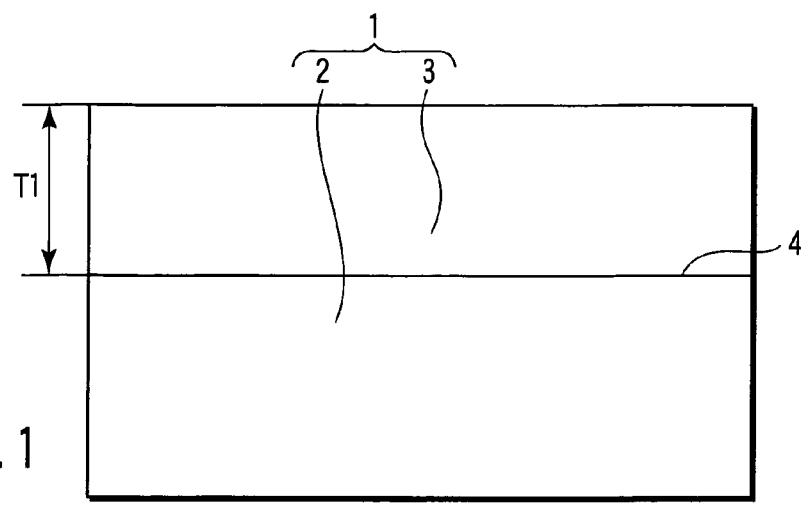
FIGS. 1 to 5 are vertical sectional views for use in explaining manufacturing steps for a solid-state image pickup device according to an embodiment of the present invention.

The above embodiment relates to a solid-state image pickup device employing an N/P$^+$ substrate and a method of manufacturing the solid-state image pickup device. To be more specific, it relates to a CMOS image sensor employing an N/P$^+$ substrate and a method of manufacturing the CMOS image sensor. They will be explained in detail as follows:

First, as shown in FIG. 1, a semiconductor substrate 1 having a two-layer structure is prepared. The semiconductor substrate 1 has a lower portion (lower layer portion) serving as a substrate body 2 which contains P-type impurities, and an upper portion (upper layer portion) serving as a first N-type semiconductor layer 3 which contains N-type impurities. To be more specific, the substrate body 2 is formed of silicon (Si), and contains boron (B) as the P-type impurities. Thus, the substrate body 2 can be referred to as a P-type semiconductor substrate. The concentration of the boron in the substrate body 2 (P-type impurity concentration) is set to, e.g., approximately $2\times10^{18}$ cm$^{-3}$. The first N-type semiconductor layer 3 is formed on a surface of the substrate body 2 by epitaxial growth. In the embodiment, the first N-type semiconductor layer 3 is deposited on the surface of the substrate body 2 by epitaxial growth, until its thickness reaches approximately 5 μm, which is indicated by an arrow T1 in FIG. 1. The first N-type semiconductor layer 3 formed by epitaxial growth contains phosphorus (P) as the N-type impurities. Therefore, the first N-type semiconductor layer 3 can be referred to as an N-type epitaxial layer. The concentration of the phosphorus in the first N-type semiconductor layer 3 (N-type impurity concentration) is set to, e.g., approximately $2\times10^{15}$ cm$^{-3}$.

In such a manner, the semiconductor substrate 1 has a two-layer structure in which the N-type epitaxial layer 3 is stacked on the P-type semiconductor substrate 2. In the following explanation, the semiconductor substrate 1 will be referred to as an N/P+ substrate 1. In general, in order to form the N/P+ substrate, on the P-type semiconductor substrate 2, the N-type epitaxial layer 3 is formed by epitaxial growth at a rate set to approximately 1 μm/min. In such setting, the boron (B) serving as the P-type impurities barely diffuses (moves) from the P-type semiconductor substrate 2 toward the P-type semiconductor substrate 1, i.e., from a deep portion (deep layer portion) of the semiconductor substrate 1 to a shallow portion (surface layer portion) of the semiconductor substrate 1. Thus, at the interface between the P-type semiconductor substrate 2 and the N-type epitaxial layer 3, the boron concentration (B concentration) changes steeply as described later. Furthermore, in the N/P$^+$ substrate 1 which is not subjected to any processing after having been formed, a PN junction surface 4 corresponds to the interface between the P-type semiconductor substrate 2 and the N-type epitaxial layer 3. That is, in the above state, in the N/P$^+$ substrate 1, the PN junction surface 4 is located at a depth of approximately 5 μm from the upper surface of the N/P$^+$ substrate 1.

Figure 2:
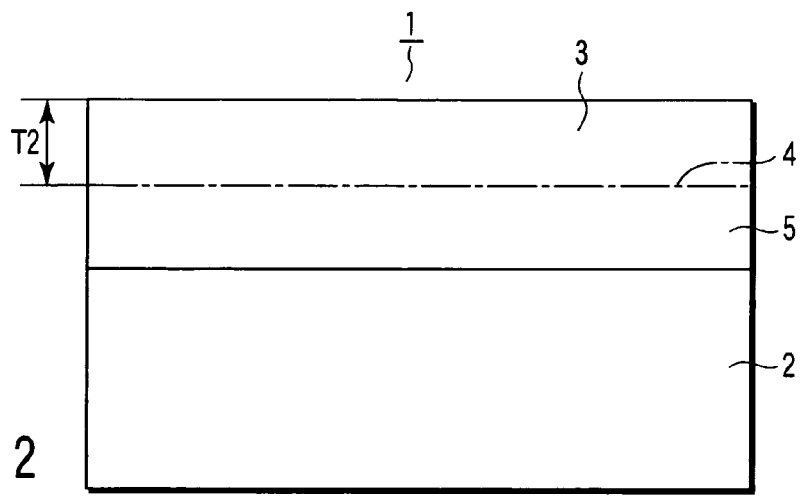

Next, as shown in FIG. 2, the N/P$^+$ substrate 1 is subjected to heat treatment, thereby diffusing the boron (B) in the P-type semiconductor substrate 2 into the N-type epitaxial layer 3. This heat treatment is carried out, for example, at approximately 1,150° C. for approximately an hour and a half. As a result, as shown in FIG. 2, the boron (B) serving as the P-type impurities diffuses from the P-type semiconductor substrate 2 into the N-type epitaxial layer 3, thereby forming a P-type well as a first P-type semiconductor layer on the P-type semiconductor substrate 2. In the N/P+ substrate 1 subjected to the heat treatment, the PN junction surface 4 corresponds to the interface between the P-type well 5 and the N-type epitaxial layer 3. Furthermore, after formation of the P-type well 5, the thickness of the N-type semiconductor layer 3 which is indicated by an arrow T2 in FIG. 2 is approximately 2.5 to 3.5 μm. That is, in the N/P+ substrate 1 subjected to the heat treatment, the PN junction surface 4 is located at a depth of approximately 2.5 to 3.5 μm from the surface of the N/P+ substrate 1. Furthermore, the B concentration of a region located in the vicinity of the PN junction surface 4 of the P-type well is approximately $2 \times 10^{15}$ cm$^{-3}$.

In such a manner, the concentration of the P-type impurities of the P-type well 5 formed on the P-type semiconductor substrate 2 is set such that the B concentration of the region located in the vicinity of the PN junction surface 4 is set at approximately $2 \times 10^{15}$ cm$^{-3}$. On the other hand, the B concentration of the P-type semiconductor substrate 2, which is the P-type impurity concentration, is set to approximately $2 \times 10^{18}$ cm$^{-3}$ as described above. That is, in the N/P+ substrate 1, the P-type impurity concentration of a region (deep portion) whose depth falls within the range of approximately 5 μm or more from the upper surface of the N/P+ substrate 1 is set to be higher than that of a region (shallow portion) whose depth falls within the range between approximately 2.5 to 3.5 μm and approximately 5 μm from the surface of the N/P+ substrate 1. In general, in a region having a high P-type impurity concentration, electrons serving as carriers easily re-couple to holes; that is, their life time is short. Therefore, when diffusing to the above deep portion, electrons generated in the N/P+ substrate 1 immediately re-couple to holes. Furthermore, when electrons generated in the above shallow portion diffuse to the deep portion, they are returned toward the surface of the N/P+ substrate 1, in the vicinity of the interface between the P-type well 5 and the N-type epitaxial layer 3, at which the P-type impurity concentration sharply changes. To be more specific, even when electrons generated in the shallow portion diffuse to the deep portion of the N/P+ substrate 1, they are returned toward the surface side of the N/P+ substrate 1, since portions of the P-type well 5 and the N-type epitaxial layer 3, which are located in the vicinity of the PN junction surface 4, have greatly different potentials.

Figure 3:
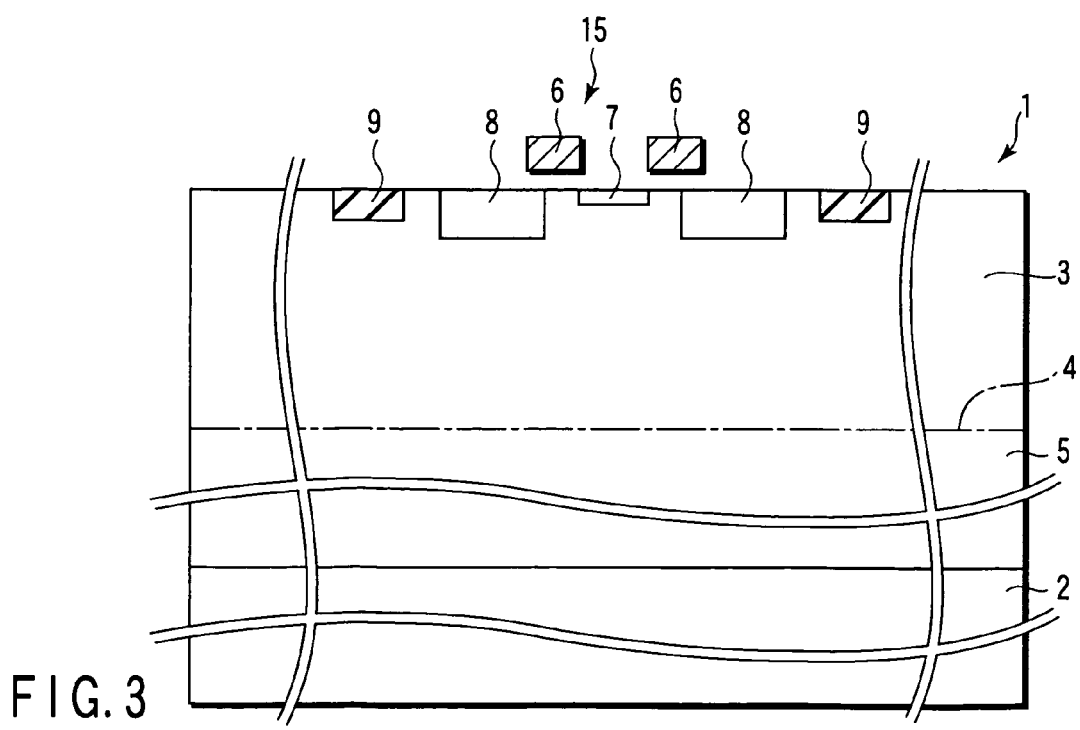

Next, as shown in FIG. 3, in the vicinity of the surface of the N/P+ substrate 1, a gate 6 and a drain 7 serving as a detection portion, of a read transistor 15, etc. are formed by an ordinary processing. In addition, in the vicinity of the surface of the N/P+ substrate 1, a capacitor and a gate electrode, etc. are formed by an ordinary processing. Their illustration will be omitted.

Subsequently, as shown in FIG. 3, photodiodes (PD) 8 are formed independently of each other in respective positions in a surface portion of the N-type epitaxial layer 3 (in the N/P+ substrate 1). To be more specific, the surface of the N-type epitaxial layer 3 is coated with a resist film not shown in a predetermined pattern. Then, phosphorus (P) is ion-implanted into the surface portion of the N-type epitaxial layer 3. In this case, the depth of that region of the N-type epitaxial layer 3, whose phosphorus concentration (P concentration) is peak, is determined mainly in accordance with the magnitude of energy in implantation of P ions. In the above embodiment, the condition for implantation of P ions is set such that the dosage of P ions is $1.2 \times 10^{12}$ cm$^{-2}$, and the acceleration is approximately 300 KeV. Under this condition, when phosphorus (P) is ion-implanted into the surface portion of the N-type epitaxial layer 3, second N-type semiconductor layers 8 are formed in respective positions in the surface portion of the N-type epitaxial layer 3, such that in each of the second N-type semiconductor layers 8, the P concentration of a region located at a depth of approximately 0.4 μm from the surface of the N-type epitaxial layer (first N-type semiconductor layer) 3 is peak. That is, a plurality of photodiodes 8 are provided in the surface portion of the N-type epitaxial layer 3. Then, in the surface portion of the N-type epitaxial layer 3, for example, shallow trench isolation (STI) 9 are formed of oxide film, as element isolation regions, in respective positions close to the photodiodes 8. The STIs 9 have a depth of approximately 0.3 to 0.35 μm.

Figure 4:
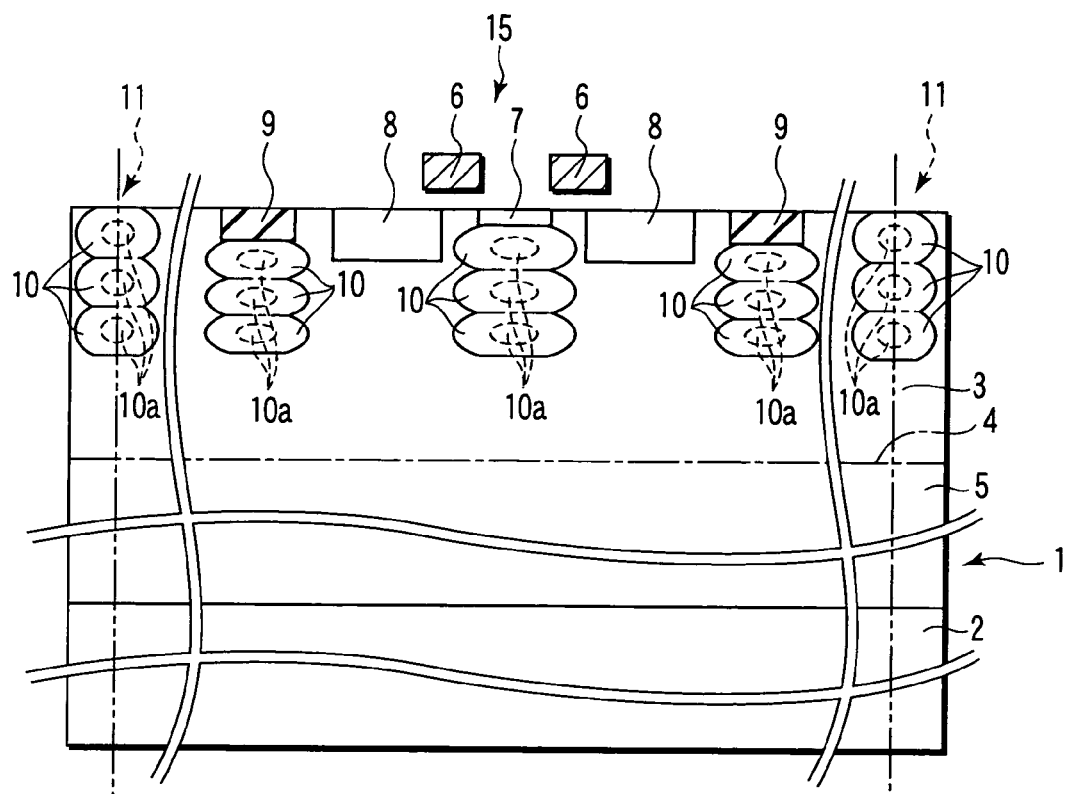

Next, as shown in FIG. 4, a plurality of second P-type semiconductor layers 10 are provided in such a pattern as to surround the photodiodes 8, and each of the second P-type semiconductor layers 10 is formed to comprise a plurality of layers provided from the surface side of the N-type epitaxial layer 3 toward the P-type well 5. In the embodiment, the second P-type semiconductor layers 10 are respectively provided under the STIs 9 and the detection portions 7, and each comprise a plurality of layers. Each second P-type semiconductor 10 is formed by ion-implanting P-type impurities such as boron (B) into the N-type epitaxial layer 3 a plurality of times. In each of the second P-type semiconductor layer 19, the B concentration of a center portion 19a is higher than that of a peripheral portion.

Figure 5:
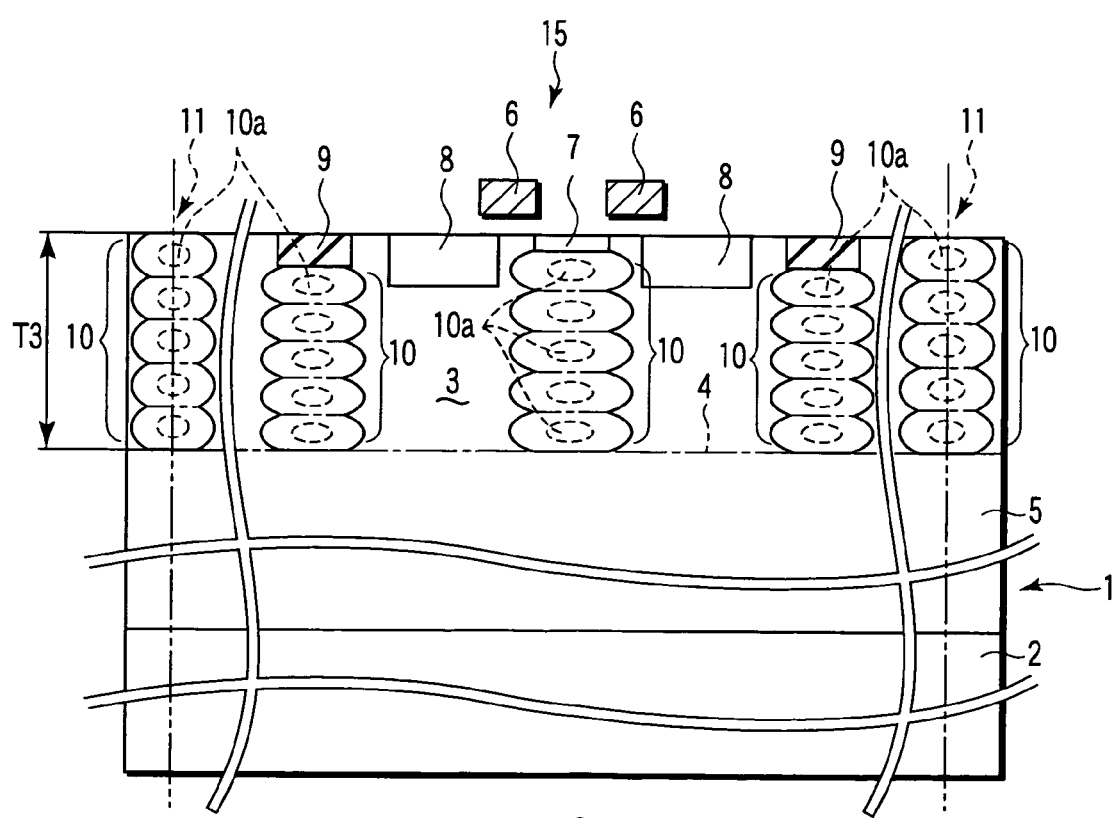

In the embodiment, as shown in FIG. 5, the second P-type semiconductor layers 10 are formed to each have five layers, under the STIs 9 and the detection portions 7. Therefore, in order to form each second P-type semiconductor layer 10, ion implantation of boron (B) is carried out five times. In this case, it is set such that the dosage of B ions and the acceleration of the first ion implantation are approximately $7 \times 10^{12}$ ions/cm$^{-2}$ and approximately 200 kV, respectively, those of the second ion implantation are approximately $5 \times 10^{11}$ ions/cm$^{-2}$ and approximately 400 kV, respectively, those of the third ion implantation are approximately $5 \times 10^{11}$ ions/cm$^{-2}$ and approximately 650 kV, respectively, those of the fourth ion implantation are approximately $5 \times 10^{11}$ ions/cm$^{-2}$ and approximately 1100 kV, respectively, and those of the fifth ion implantation are approximately $5 \times 10^{11}$ ions/cm$^{-2}$ and approximately 1700 kV, respectively. Under this condition, when the ion implantation is carried out five times, as shown in FIG. 5, the gaps between the STIs 9 and the P-type well 5 and the detection portions 7 and the P-type well 5 are filled with the second P-type semiconductor layers 10. That is, when all the above first to fifth ion-implantations are completed, the N-type epitaxial layer 3 located between the STIs 9 and the P-type well 5 and between the detection portions 7 and the P-type well 5 is made substantially P-type semiconducting due to the second P-type semiconductor layers each comprising five layers. It should be noted that in each of the second P-type semiconductor layers 10 provided under the detection portions 7, the uppermost one of the five layers of each second P-type semiconductor layer 10 also functions as a so-called punch-through stopper layer.

Furthermore, in thermal diffusion in the above ion-implantation process, boron (B) in the P-type semiconductor substrate 2 diffuses therefrom toward the N-type epitaxial layer 3. Thereby, the PN junction surface 4 which is the interface between the N-type epitaxial layer 3 and the P-type well 5 further rises toward the surface side of the N/P+ substrate 1, as compared with that when ion-implantation is not yet carried out. More specifically, the thickness of the N-type semiconductor layer 3 subjected to all the first to fifth ion-implantations, which is indicated by an arrow T3, is approximately 2.0

μm. That is, when all the ion-implantations are completed, the PN junction surface 4 is located at a depth of approximately 2.0 μm from the surface of the N/P⁺ substrate 1. Therefore, the N-type epitaxial layer 3 having a thickness of approximately 2 μm, which is substantially equivalent to the distance between the surface of the N/P⁺ substrate 1 and the PN junction surface 4, can be made substantially P-type semiconducting by the second P-type semiconductor layers 10 each comprising five layers.

In such a manner, the second P-type semiconductor layers 10 are formed to extend from the STIs 9 and the detection portions 7 to the surface portion of the P-type well 5 to surround the photodiodes 8, such that the five layers of each second P-type semiconductor layer 10 are continuously formed. Thereby, the photodiodes 8 are electrically isolated from each other. In other words, the photodiodes 8 are electrically isolated from each other by the second P-type semiconductor layers which are provided to respectively and three-dimensionally surround the photodiodes, and each of which comprises five layers. Therefore, the second P-type semiconductor layers provided under the STIs 9 and the detection portions 7 function as barrier layers which electrically isolate the photodiodes 8 from each other.

In the embodiment, as shown in FIGS. 4 and 5, when boron (B) is ion-implanted into regions located the STIs 9 and the detection portions 7, boron (B) is also ion-implanted into chip cut portions 11 for use in cutting the N/P⁺ substrate 1 into a number of chips, which are indicated by double-dashed chain lines. The chip cut portions 11 will be referred to as dicing line portions. To be more specific, in the embodiment, when the second P-type semiconductor layers 10 each comprising five layers are formed as barrier layers under the STIs 9 and the detection portions 7, boron (B) is also ion-implanted into the dicing line portions 11. Thereby, second P-type semiconductor layers 10 each comprising five layers are also formed to extend, along the dicing line portions 11, from the surface of the N-type epitaxial layer 3 to the surface portion of the P-type well, such that the five layers of each second P-type semiconductor layer 10 are continuously formed, as well as the second P-type semiconductor layers 10 formed under the STIs 9 and the detection portions 7. That is, in the dicing line portions 11 of the N/P⁺ substrate 1 also, portions of the N-type epitaxial layer 3 which have a thickness of approximately 2 μm from the surface of the N/P⁺ substrate 1 to the PN junction surface 4 are made substantially P-type semiconducting by the second P-type semiconductor layers each comprising five layers. Due to such manufacturing steps, the portions of the second P-type semiconductor layers 10 which serve as the barrier layers and the portions of the second P-type semiconductor layers which serve as the dicing line portions 11 can be easily formed at the same time without increasing the number of manufacturing steps. The N/P⁺ substrate 1 is cut into a plurality of chips along the dicing line portions 11 in a later step. Each of the dicing line portions 11 is formed of a second P-type semiconductor layer 10, a P-type well 5 and a P-type semiconductor substrate 2, which are located between the upper and lower surfaces of the N/P⁺ substrate 1. As may be understood from the above, when the N/P⁺ substrate 1 is cut along each of the dicing line portions 11, no PN junction surface appears.

Next, as shown in FIG. 6, shield layers 12 are provided in surface portions of the photodiodes 8 in order for the photodiodes 8 to have a Surface-Shield-Sensor structure, i.e., a so-called S3 structure. More specifically, first, the surfaces of the photodiode 8 are coated with resist films not shown in a predetermined pattern. Then, boron (B) is ion-implanted as P-type impurities into the surface portions of the photodiodes 8. In this case, this ion implantation is set such that the dosage of B ions is $10\times10^{13}$ cm$^{-2}$, and the acceleration is approximately 10 KeV. Thereby, the surfaces (surface level) of the photodiodes 8 are covered and shielded by P-type semiconductor layers 12 formed of boron (B). That is, PD-p layers 12 are formed at the surface portions of the photodiodes 8. As a result, the N-type semiconductor layers 8 which substantially performs optical/electrical conversion are filled into the surface portion of the N/P⁺ substrate 1 (N-type epitaxial layer 3), and the photodiodes 8 are formed in the surface portion of the N/P⁺ substrate 1 (in the N-type epitaxial layer 3) to have an S3 structure in which the surface of the N-type semiconductor layer 8 is shielded by the P-type semiconductor layer (PD-p layer) 12. In such a structure, in the vicinity of the surface of each photodiode 8, the concentration of boron (B) which is P-type impurities is re-increased to a high level, i.e., approximately $1\times10^{19}$ cm$^{-3}$.

Thereafter, predetermined manufacturing steps such as a step of forming AL wiring are carried out by an ordinary method, and the N/P⁺ substrate 1 is diced to obtain a number of chips along the dicing line portions 11. Consequently, manufacturing of the solid-state image pickup device 13 according to the above embodiment is completed. Thereby, the solid-state image pickup device 13 is formed to have a desired structure. That is, a CMOS image sensor 13 is formed as an amplification-type solid-state image pickup element, such that an N/P⁺ substrate 1 is used, and the photodiodes 8 are electrically isolated from each other such that they are respectively and three-dimensionally surrounded by the P-type well and the second P-type semiconductor layers 10 comprising a number of layers, and no PN junction surface appears in the cut sections of the chips.

FIG. 7 is a plan view of the CMOS image sensor 13 shown in FIG. 6. As is clear from FIG. 7, the photodiodes 8 are surrounded by the second P-type semiconductor layers 10 on their four sides. In addition, the photodiodes 8 are electrically isolated from each other by the second P-type semiconductor layers 10.

FIG. 8 is a simplified circuit diagram of a main portion of the CMOS image sensor 13. The CMOS image sensor 13 comprises a reset transistor 14, a read transistor 15, an amplification transistor 16, an address transistor 17 and a diode 18, etc. The source/drain of the reset transistor 14 and the source/drain of the read transistor 15 are directly connected to each other. Similarly, the source/drain of the amplification transistor 16 and the source/drain of the address transistor 17 are directly connected to each other. The gate of the amplification transistor 16 is directly connected to the source/drain of the rest transistor 14 and the source/drain of the read transistor 15. Furthermore, a cathode terminal of the diode 18 is directly connected to the source (drain) of the read transistor 15.

As explained in the "Background of the Invention" portion, in the case of manufacturing a CMOS image sensor by using a P/P⁺ substrate, a plurality of photodiodes are formed of N-type semiconductor layers, on a P-type epitaxial layer formed of a P-type semiconductor layer. The photodiodes are electrically isolated from each other. On the other hand, in the CMOS image sensor 13 according to the embodiment of the present invention which is manufactured by using the N/P⁺ substrate 1, a plurality of photodiodes 8 are formed of N-type semiconductor layers, in the N-type epitaxial layer 3 formed of an N-type semiconductor layer. Thus, in the CMOS image sensor 13, if a conventional method of forming photodiodes by using the P/P⁺ substrate is applied, it is highly possible that the photodiodes may be electrically connected to each other. When they are electrically connected to each other, electrons generated in the optical/electrical conversion are not used to produce an appropriate signal, which is to be subjected to signal processing. Consequently, color crosstalk occurs, thus resulting in degradation of a reproduced image and lowering of the image quality, etc.

As a measure for preventing lowering of the image quality which would occur due to electrically connection of the photodiodes, as explained in the "Background of the Invention" portion, in the CCD image sensor using the N-type substrate, P-type semiconductor layers are formed of boron (B) in such a manner as to surround the photodiodes. Also, in the image sensor 13 according to the embodiment of the present invention using the N/P$^+$ substrate 1, as shown in FIGS. 4 to 6, a plurality of second P-type semiconductor layers 10 are formed of boron (B) to surround the photodiodes 8 as in the CCD image sensor using the N-type substrate. That is, in the CMOS image sensor 13, in order that the photodiodes 8 be electrically isolated from each other, B ions are implanted into the N-type epitaxial layer 3 to surround the photodiodes 8 by an accelerator not shown. Then, the second P-type semiconductor layers 10 are formed of the B ions implanted into the N-type epitaxial layer 3 to function as barrier layers which electrically isolate the photodiodes 8 from each other.

Furthermore, in the CMOS image sensor 13 formed by using the N/P$^+$ substrate 1, in heat treatment steps of the manufacturing steps, boron (B) is diffused from the P-type semiconductor substrate which is a P$^+$ region, into the N-type epitaxial layer 3. That is, boron (B) is diffused from the lower surface side of the N/P$^+$ substrate 1 toward the upper surface side thereof. Thereby, the P-type well 5 is gradually enlarged from the lower surface side of the N/P$^+$ substrate 1 toward the lower surface side thereof, as the manufacturing step to be carried out to form the CMOS image sensor proceeds. That is, the PN junction surface 4 is gradually shifted from a shallow portion of the N/P$^+$ substrate 1 to a deep position thereof. As a result, the STIs 9 and the detection portions (drains) 7 formed in the surface portion of the N/P$^+$ substrate 1 (N-type epitaxial layer 3) and the P-type well 5, which faces the N-type epitaxial layer 3 to form the PN junction surface 4, is continuously connected to each other by the second P-type semiconductor layers 10 functioning as the barrier layers. Thereby, in the CMOS image sensor 13 formed by using the N/P$^+$ substrate 1, the photodiodes 8 are individually and three-dimensionally surrounded by the STIs 9, the detection portions (drains) 7, and the P-type semiconductor layers (barrier layers) 10, whereby they can be electrically isolated from each other.

In the CMOS image 13 sensor having the above structure, even if strong light such as sunlight is incident on the photodiodes 8, and electrons leak from a photodiode 8, movement of the electrons is limited by the STIs 9, the detection portions (drains) 7, the P-type semiconductor layers (barrier layers) 10 and the P-type well 5. That is, there is little possibility that electrons leaking from the above photodiode 8 may pass through a deep portion of the N/P$^+$ substrate 1 to enter another photodiode 8. Therefore, in the CMOS imaging sensor 13, due to the structure, there is little possibility that blooming, etc., will occur.

Furthermore, a pixel portion of the CMOS image sensor 13 can be formed in the same conventional method as in the case where a CMOS image sensor is formed by using the P/P$^+$ substrate. That is, the pixel portion of the CMOS image sensor 13 can be formed without providing specific manufacturing steps required for the N/P$^+$ substrate 1.

Furthermore, kinds of semiconductor devices such as the solid-state image pickup device are cut out by dicing a single wafer at the final manufacturing step. In the CMOS image sensor manufactured by using the P/P$^+$ substrate, at all the cut sections of the chips, P-type semiconductor layers appear, or in addition to P-type semiconductor layers, oxide films appear in surface portions of the sections. Therefore, in the CMOS image sensor having the P/P$^+$ substrate, no PN junction surface appear at the sections of the chips. Furthermore, in the CCD image sensor manufactured by using the N-type semiconductor substrate, in general, phosphorous (P) is ion-implanted or dissolved as N-type impurities into the dicing line portions, etc. Thus, in the CCD image sensor manufactured by using the N-type semiconductor substrate, at all the sections of the chips, N-type semiconductor layers appear. Therefore, in the CCD image sensor manufactured by using the N-type semiconductor substrate, no PN junction surface appears at the sections of the chips, as in the CMOS image sensor manufactured by using the P/P$^+$ substrate.

However, in the CMOS image sensor manufactured by using the N/P$^+$ substrate, the deep portion (lower surface side) of the substrate is a P-type semiconductor substrate, and the shallow portion (upper surface side) of the substrate is an N-type semiconductor layer. To be more specific, when chips are cut out from the N/P$^+$ substrate, PN junction surfaces appear at the sections of the chips. When the PN junction surfaces appear, it may cause leakage of current between the P$^+$ region of the deep portion of the substrate and the N-type epitaxial region of the substrate surface portion. The leak current may cause a displayed image to be uneven when the image is dark, due to the characteristics of the device. That is, it may cause lowering of the image quality.

In order to prevent generation of such leak current and lowering of the image quality which would occur due to the leakage of current, in the CMOS image sensor 13 manufactured by using the N/P$^+$ substrate 1, in the case of forming the second P-type semiconductor substrates 10 functioning as the barrier layers, boron (B) is also ion-implanted into the dicing line portions 11, thereby forming second P-type semiconductor layers 10. The second P-type semiconductor layers 10 are continuously formed from surface of the N/P$^+$ substrate 1 (N-type epitaxial layer 3) to the surface of the P-type well 5. Thereby, the dicing line portions 11 from the upper and lower surfaces of the N/P$^+$ substrate 1 are substantially P-type semiconducting. As a result, at the sections of the chips cut out by dicing the N/P$^+$ substrate 1 at the dicing line portions 11, P-type semiconductor layers appear to have a two-layer structure in which the deep portion (lower surface side) of the substrate is formed of a P-type semiconductor layer, and the shallow portion (upper surface side) of the substrate is also formed of a P-type semiconductor layer. That is, at all the sections of the chips, P-type semiconductor layers appear. Therefore, in the CMOS image sensor 13 according to the embodiment, no PN junction surface 4 appears at the sections of the chips, as in the CMOS image sensor using the P/P$^+$ substrate and the CCD image sensor using the N-type semiconductor substrate.

Furthermore, in the CMOS image sensor 13, the second P-type semiconductor layers 10 of the dicing line portions 11 are formed in parallel with formation of the second P-type semiconductor layers 10 serving as the barrier layers. To be more specific, in the case of boron (B) is ion-implanted as P-type impurities into the surface portion (N-type epitaxial layer 3) of the N/P$^+$ substrate 1 in order to form the second P-type semiconductor layers 10 serving as the barrier layers, boron (B) is also ion-implanted as P-type impurities into the dicing line portions 11. In such a manner, the second P-type semiconductor layers 10 of the dicing line portions can be formed in parallel with formation of the second P-type semiconductor layers serving as the barrier layers. Therefore, according to the embodiment, the second P-type semiconductor layers 10 of the dicing line portions 11 can be formed without the need to provide specific manufacturing steps. That is, according to the embodiment, the second P-type semiconductor layers 10 serving as the barrier layers and the second P-type semiconductor layers 10 of the dicing lines portions 11 can be easily and speedily formed in parallel with each other.

Next, the impurity concentration, electron distribution and potential of the CMOS image sensor according to the above embodiment in the thickness direction of the N/P$^+$ substrate 1 will be explained with reference to FIG. 9. The graph in FIG. 9 shows the impurity concentration, electron distribution and potential of that portion of the CMOS image sensor shown in FIG. 6, which is taken along a one-dot-dash line A-A' in FIG. 6.

First of all, upper part of the graph in FIG. 9 will be explained. In the upper part of the graph, a zone B indicates the impurity concentration of the PD-p layer 12 serving as the shield layer which is formed of a P-type semiconductor layer; a zone C indicates the impurity concentration of the photodiode 8; a zone D indicates the impurity concentration of the N-type epitaxial layer 3; a zone E indicates the impurity concentration of the P well 5; and a zone F indicates the impurity concentration of the P-type semiconductor substrate 2.

As is clear from the graph in FIG. 9, the impurity concentration, i.e., the P concentration, gradually decreases from the deep portion of the P-type semiconductor substrate 2 to the surface of the P-type well 5. Then, the impurity concentration at the interface between the P-type well 5 located at a depth of approximately 2.0 μm and the N-type epitaxial layer 3 rapidly changes to exhibit a steep profile, since the impurities in the P-type well 5 and those in the N-type epitaxial layer are different from each other. Further, the impurity concentration at the interface between the N-type epitaxial layer 3 and the photodiode 8 formed of the N-type semiconductor layer smoothly changes, since the impurities in the N-type epitaxial layer 3 and those in the photodiode 8 are the same. Then, in the photodiode 8, the impurity concentration, i.e., the N concentration, is peak at a depth of 0.4 μm. Furthermore, at the interface between the photodiode 8 and the PD-d layer 12 formed of the P-type semiconductor layer, the impurity concentration is lowered, since the impurities in the photodiode 8 and those in the PD-d layer 12 are different. Then, the impurity concentration of the PD-d layer 12, i.e., the P concentration, is peak in the vicinity of the surface of at the PD-d layer 12. In addition, as shown by a broken line in FIG. 9, the peak (maximum) of the distribution of electrons. (carriers) in the N/P$^+$ substrate 1 is substantially coincident with the peak (maximum) of the impurity concentration of the photodiode 8.

Next, lower part of the graph in FIG. 9 will be explained. The lower part indicates the distribution of the potential of the N/P$^+$ substrate 1. As is clear from the upper part and the lower part of the graph in FIG. 9, the depth of part of the N/P$^+$ substrate 1, whose portion is the lowest (minimum), is substantially equivalent to that of part of the photodiode 8, whose impurity concentration (N concentration) is the highest (maximum), and that of part of the N/P$^+$ substrate 1, whose electron distribution is peak (maximum). That is, electrons in the N/P$^+$ substrate 1 move as in a well-known physical phenomenon. To be more specific, even if electrons generated in the N/P$^+$ substrate 1 by optical/electrical conversion of the photodiodes leak from the photodiodes 8, and move toward the P-type semiconductor substrate 2, i.e., the deep portion side of the N/P$^+$ substrate 1, they are returned toward the surface side of the N/P$^+$ substrate 1 due to the potential difference. Then, the electrons leaking from the photodiodes 8 finally return into the photodiodes 8 whose potential is low in the N/P$^+$ substrate 1, due to their diffusion, and in particular, they return into part of the photodiodes 8, the impurity concentration of which is the highest in the photodiodes 8, and the potential of which is the lowest (minimum). As a result, in the CMOS image sensor 13 using the N/P$^+$ substrate 1, the sensitivity of the photodiodes 8 can be improved.

In such a manner, according to the embodiment, in the CMOS image sensor 13 using the N/P$^+$ substrate 1, the concentration profiles of the P-type impurities (B) and N-type impurities (P) can be easily set such that the sensitivity of the photodiodes 8 can be improved. That is, according to the embodiment, impurity concentration profiles in which the sensitivity of the photodiodes 8 are improved can be easily obtained with respect to the CMOS image sensor 13 using the N/P$^+$ substrate 1.

Figure 10:
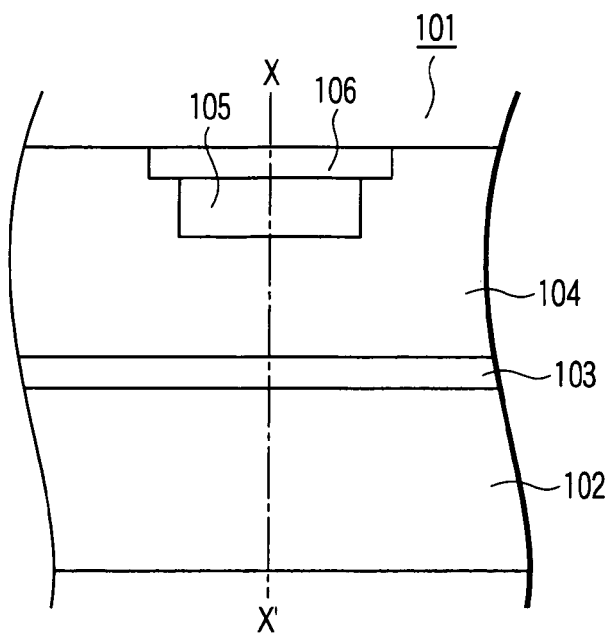
FIG. 10 is a vertical sectional view of a solid-state image pickup device provided as the first comparison example, which is related to the prior art of the present invention.
Figure 11:
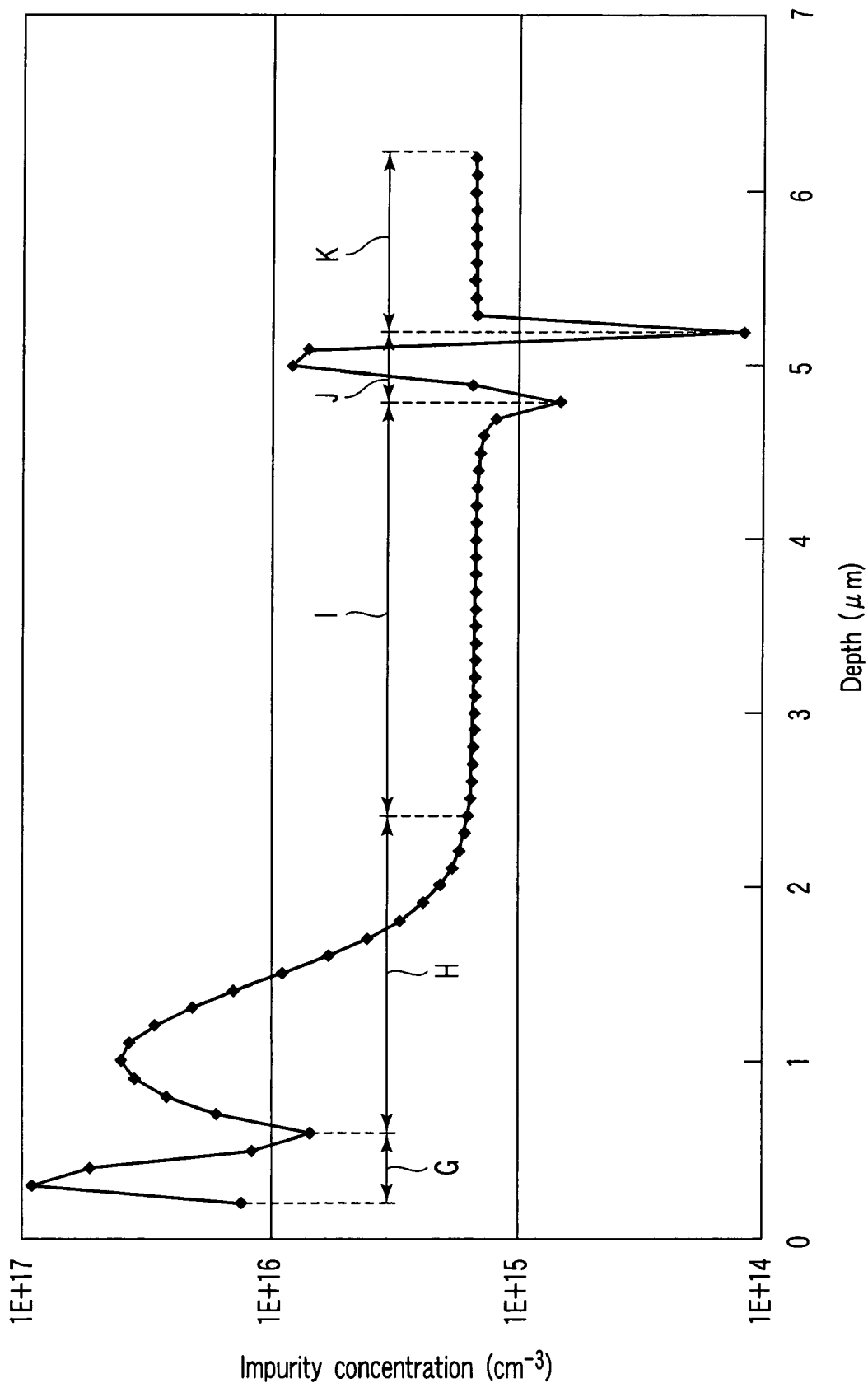
FIG. 11 is a graph indicating the impurity concentration of part of the solid-state image pickup device shown in FIG. 10, which is taken along a one-dot-dash line X-X' in FIG. 10.
Figure 12:
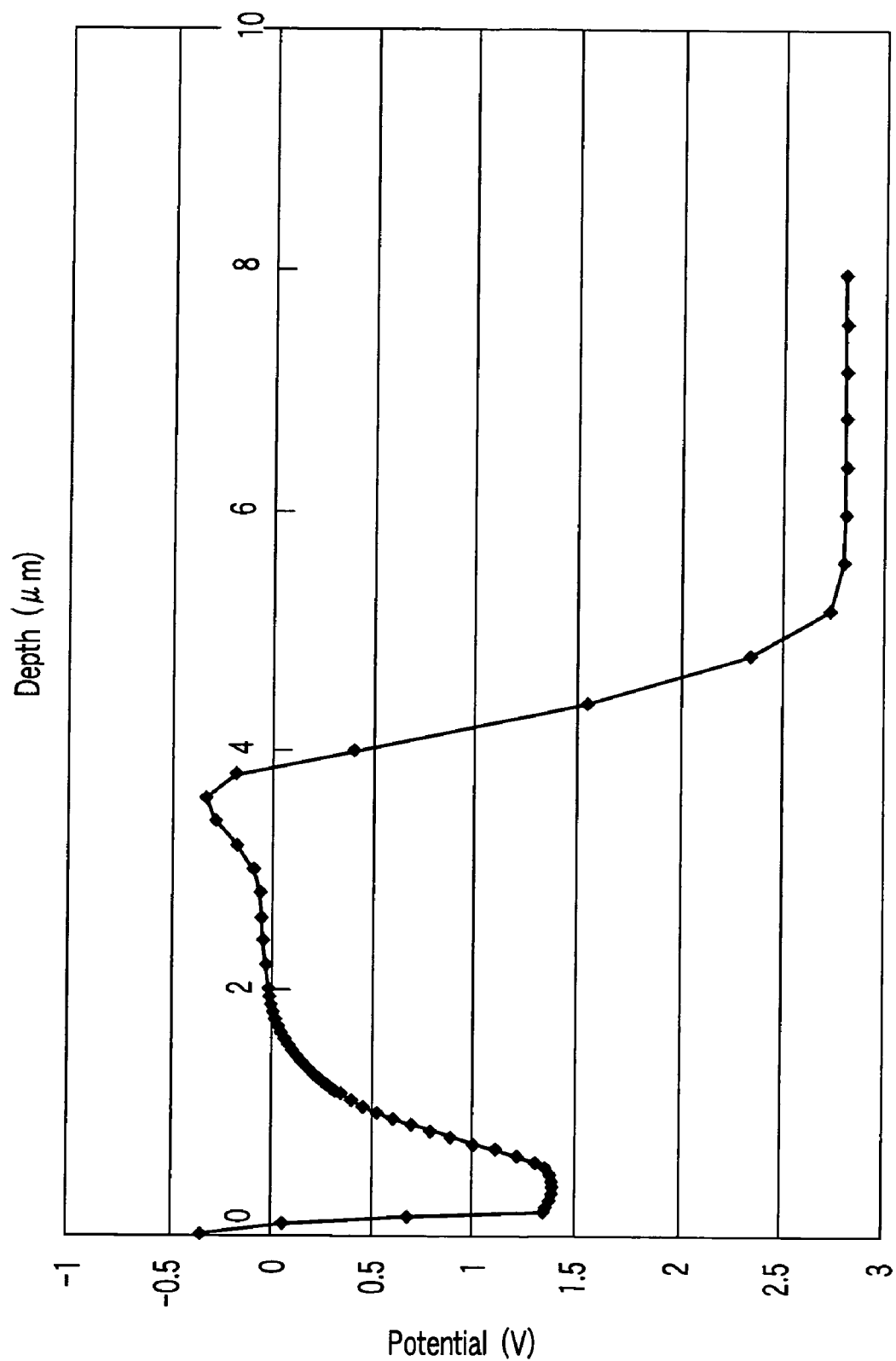
FIG. 12 is a graph indicating the potential of the above part of the solid-state image pickup device shown in FIG. 10.
Figure 13:
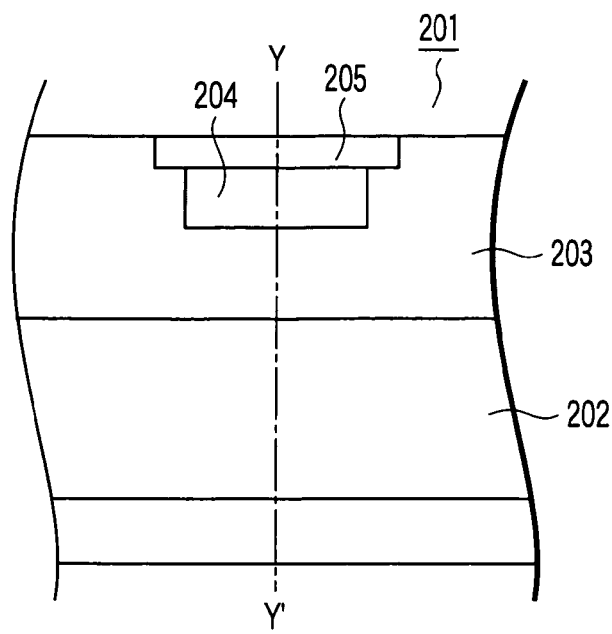
FIG. 13 is a vertical sectional view of another solid-state image pickup device provided as a second comparison example, which is related to the prior art of the present invention.
Figure 14:
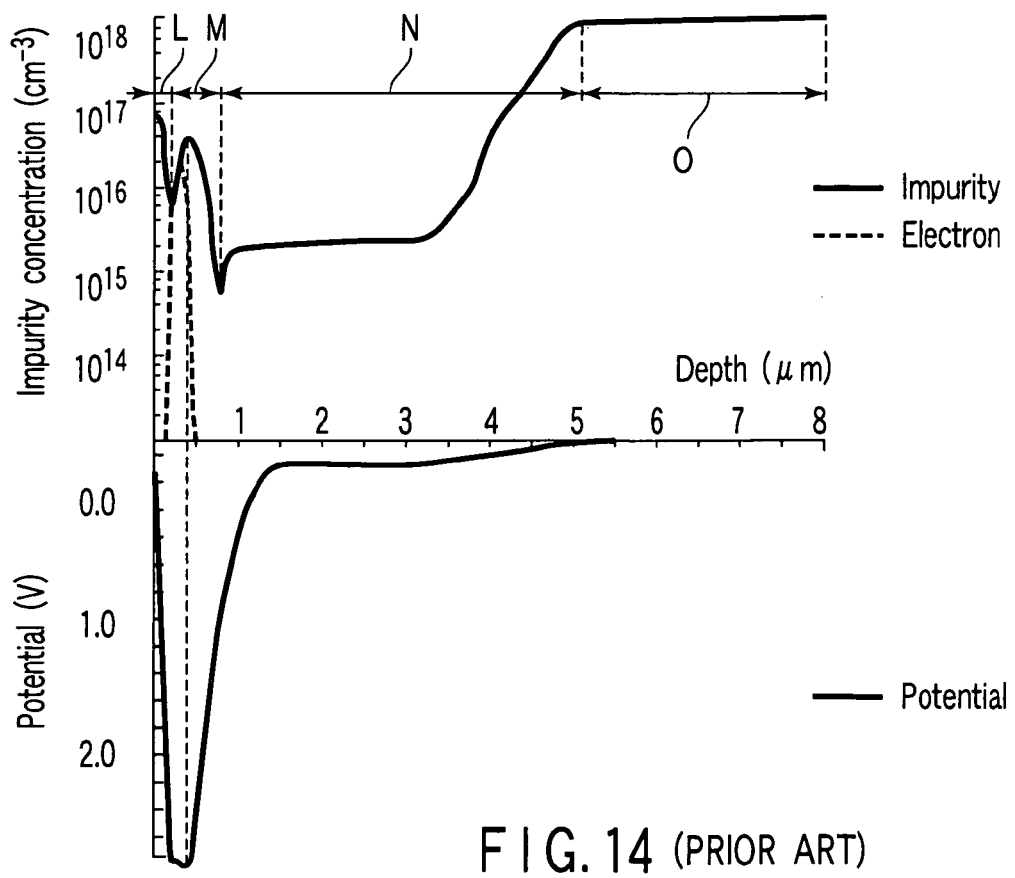
FIG. 14 is a graph indicating the impurity concentration, electron distribution and potential of part of the solid-state image pickup device provided as the second comparison example shown in FIG. 13, which is taken along a one-dot-dash line Y-Y' in FIG. 13.

Next, solid-sate image pickup devices provided as first and second comparison examples, which are to be compared with the solid-state image pickup device according to the embodiment, will be explained with reference to FIGS. 10 to 14. FIG. 10 is a vertical sectional view of a solid-state image pickup device provided as the first comparison example, which is related to the prior art of the present invention. FIG. 11 is a graph indicating the impurity concentration of part of the solid-state image pickup device shown in FIG. 10, which is taken along a one-dot-dash line X-X' in FIG. 10. FIG. 12 is a graph indicating the potential of the above part of the solid-state image pickup device shown in FIG. 10. FIG. 13 is a vertical sectional view of another solid-state image pickup device provided as the second comparison example, which is to be compared with the solid-state image pickup device according to the embodiment, and is related to the prior art of the present invention. FIG. 14 is a graph indicating the impurity concentration, electron distribution and potential of part of the solid-state image pickup device provided as the second comparison example shown in FIG. 13, which is taken along a one-dot-dash line Y-Y' in FIG. 13.

First of all, a CCD image sensor 101, which is provided as the first comparison example, will be explained with reference to FIG. 10. As shown in FIG. 10, in the CCD image sensor 101, a flat P-type well 103 is provided on an N-type semiconductor substrate 102. On the flat P-type well 103, an epitaxial layer is provided. At a surface portion of the N-type epitaxial layer 104, a photodiode 105 is formed of an N-type semiconductor layer. A surface of the photodiode 105 is covered by a PD-p layer 106 serving as a shield layer, which is formed of a P-type semiconductor layer.

Next, the impurity concentration of the CCD image sensor 101 in the thickness direction of the substrate will be explained. The graph in FIG. 11 shows the impurity concentration of part of the CCD image sensor which is taken along the one-dot-dash line X-X' in FIG. 10. In the graph of FIG. 11, a zone G indicates the impurity concentration of the PD-p layer 106; a zone H indicates that of the photodiode 105; a zone I indicates that of the N-type epitaxial layer 104; a zone J indicates that of the flat P-type well 103; and a zone K indicates that of the N-type semiconductor substrate 102. As is clear from the graph of FIG. 11, the peak of the impurity concentration of the flat P-type well 103 is higher than those of the N-type epitaxial layer 104 and the N-type semiconductor substrate 102, which are located above and below the flat P-type well 103.

Next, the potential of the CCD image sensor 101 in the thickness direction of the substrate will be explained with reference to FIG. 12. The graph of FIG. 12 indicates the distribution of the potential of part of the CCD image sensor 101 which is taken along the one-dot-dash line X-X' in FIG. 10. As is clear from the graph of FIG. 12, the peak (maximum) of the potential of the CCD image sensor 101 corresponds to the potential of a region located at a depth of approximately 3.7 μm from the surface of the N-type epitaxial layer 104. Also, it can be seen from the graph that electrons generating in a region shallower than the above region (located at the depth of approximately 3.7 μm from the surface of the N-type epitaxial layer 104) are concentratedly moved to a region located at a depth of approximately 0.5 μm, whose potential is low. Furthermore, it can be seen that electrons generating in a region deeper than the above region (located at the depth of approximately 3.7 μm from the surface of the N-type epitaxial layer 104) are moved toward a deeper region of the substrate.

According to the profile of the impurity concentration of the part of the image sensor 101 which is taken along the one-dot-dash line X-X' and that of the potential of the above part of the image sensor 101, as shown in FIGS. 11 and 12, it can be seen that in the CCD image sensor 101, when strong light such as sunlight is incident on the photodiodes 105, and a large number of electrons generate, excess electrons thereof are moved into the N-type semiconductor substrate 102 through the flat P-type well 103. Needle to say, the impurity concentration and the profile of the flat P-type well are set such that the flat P-type well allows excess electrons to pass therethrough.

However, due to above setting, the following problems arise: for example, electrons generating in a region deeper than the flat P-type well 103 are all moved into the N-type semiconductor substrate 102. As a result, there is a strong possibility that the sensitivity may lower. Furthermore, when strong light such as sunlight is incident on the photodiodes 105 to generate a large number of electrons, and then excess electrons remain, blooming or color crosstalk occurs. Also, when electrons generating at a deep portion of the N-type semiconductor substrate 102 enter another photodiode 105, blooming or color crosstalk occurs. In the CCD image sensor 101 having the structure shown in FIG. 10, it is highly possible that the sensitivity may be lowered, or lowering of the image quality such as blooming or color crosstalk may occur. Therefore, the above CCD image sensor 101 is disadvantageous in order that the elements be further minutely formed.

Next, the CMOS image sensor 201 provided as the second comparison example will be explained with reference to FIG. 13. As shown in FIG. 13, in the CMOS image sensor 201, a P-type epitaxial layer 203 is provided on a P-type semiconductor substrate 202. In a surface portion of the P-type epitaxial layer 203, a photodiode 204 is formed of an N-type semiconductor layer. A surface of the photodiode 204 is covered by a PD-p layer 205 serving as a shield layer, which is formed of a P-type semiconductor layer.

Then, the impurity concentration, electron distribution and potential of the CMOS image sensor 201 in the thickness direction will be explained with reference to FIG. 14. To be more specific, the graph of FIG. 14 shows the impurity concentration, electron distribution and potential of part of the CMOS image sensor 201 which is taken along the one-dot-dash line Y-Y' in FIG. 13.

First of all, upper part of the graph of FIG. 14 will be explained. In the graph, a zone L indicates the impurity concentration of a PD-p layer 205; a zone M indicates that of a photodiode 204; a zone N indicates that of a P-type epitaxial layer 203; and a zone O indicates that of a P-type semiconductor substrate 202. As is clear from the graph of FIG. 14, the impurity concentration, i.e., the P concentration, increases from a deep portion of the P-type epitaxial layer 203 toward the P-type semiconductor substrate 202. The P concentration of the P-type semiconductor substrate 202 is set to be the highest in the CMOS image sensor 201. Also, as indicated by a broken line in the upper part of the graph of FIG. 14, the peak of the distribution of electrons (carries) in the CMOS image sensor 201 is located in the photodiode 204.

Then, lower part of the graph of FIG. 14 will be explained. The lower part of the graph indicates the potential of the CMOS image sensor 201. As is clear from the upper part and lower part of the graph of FIG. 14, the position of part of the CMOS image sensor 201, whose potential is the lowest (minimum), is substantially coincident with that of part of the photodiode 8, whose impurity concentration (N concentration) is the highest (maximum).

According to the above profiles of the impurity concentration, electron distribution and potential of the part of the CMOS image sensor 201 which is taken along the one-dot-dash line Y-Y' in FIG. 14, it can be seen that the CMOS image sensor 201 has the following features: even if strong light such as sunlight is incident on the photodiodes 204 to generate a large number of electrons generates, and those electrons diffuse to reach a deep portion of the CMOS image sensor 201, their life time is short since the impurity concentration of the P-type semiconductor substrate 201 is high. That is, the electrons reaching the deep portion of the CMOS image sensor 201 immediately re-couple to holes. Thereby, the electrons generating from a photodiode 204 due to light incident thereon are prevented from entering another photodiode 204 adjacent to the above photodiode 204 through the deep portion of the CMOS image sensor 201. Furthermore, even if electrons generated from the photodiodes 204 diffuse from the surface portion side of the CMOS image sensor 201 to the deep portion side of the substrate, they are returned toward the surface portion side of the CMOS image sensor 201, at the interface between the P-type epitaxial layer 203 and the photodiodes 204, where the impurity concentration sharply changes. Of the electrons returned toward the surface portion side of the CMOS image sensor 201, there are electrons which are re-moved into the photodiodes 204 on which the light is incident, due to their diffusion.

However, in the above setting, the depletion layer of the photodiode 204 is hard to widen, since the CMOS image sensor 201 is designed to be driven with a low voltage, as compared with the above CCD image sensor 101. That is, in the CMOS image sensor 201, it is difficult to adopt a method in which the depletion layer of the photodiode 204 is widened to improve the sensitivity, to thereby compensate for lowering of the sensitivity which occurs when the device is further minutely formed.

As explained above, the solid-state image pickup device according to the above embodiment is improved in structure of the substrate, and also in image quality, sensitivity and electrical characteristics. That is, in the CMOS image sensor 13 according to embodiment, the sensitivity of each of the photodiodes 8 is improved without increasing the light receiving area of each photodiode 8 and the driving voltage of the CMOS image sensor 13. In addition, in the CMOS image sensor according to the embodiment, there is little possibility that degradation of the image quality such as blooming or color crosstalk may occur, or leakage of current may occur.

It should be noted that the solid-state image pickup device and the method of manufacturing the same, according to the present invention, are not limited to the above embodiment. When the invention is put to practical use, some structural features or manufacturing steps may be variously changed in setting, or various setting may be combined appropriately or as occasion arises.

For example, the step of forming the second P-type semiconductor layers 10 in the dicing line portions 11 of the CMOS image sensor 13 need not to be carried out in parallel with the step of forming the second P-type semiconductor layers 10 serving as the barrier layers. For example, the step of forming the second P-type semiconductor layers 10 in the dicing line portions 11 may be carried out in parallel with the step of forming the P-type well 5 which is the first P-type semiconductor layer. In this case also, it is not necessary to provide a specific step, i.e., it is not necessary to increase the number of steps. Therefore, the second P-type semiconductor layers 10 can be easily and speedily formed in the dicing line portions 11.

Furthermore, as the element isolation regions formed in the surface portion of the CMOS image sensor 13, the above STIs 9 need not to be adopted. For example, instead of the STIs 9, LOCOS may be formed. Furthermore, the STIs 9 need not to be formed before formation of the second P-type semiconductor layers 10. For example, they may be formed after formation of the second P-type semiconductor layers 10.

In addition, the gate 6, etc. of the read transistor 15 need not to be formed before formation of the photodiodes 8. For example, the photodiodes 8 may be formed after formation of the gate 6, etc. of the read transistor 15.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A solid-state image pickup device comprising:
   a semiconductor substrate which comprises a substrate body containing P-type impurities and a first N-type semiconductor layer containing N-type impurities, the first N-type semiconductor layer being provided on the substrate body, and including a first P-type semiconductor layer which contains p-type impurities, and which is located on the substrate body;
   a plurality of optical/electrical conversion portions formed of second N-type semiconductor layers which are provided independently of each other in respective positions in a surface portion of the first N-type semiconductor layer; and
   a plurality of second P-type semiconductor layers which are formed to surround the optical/electrical conversion portions, which are provided along element isolation regions provided in respective positions in the surface portion of the first N-type semiconductor layer, and which continuously extend from the surface portion of the first N-type semiconductor layer to a surface portion of the first P-type semiconductor layer,
   wherein the concentration of the P-type impurities contained in the substrate body is higher than that of the P-type impurities contained in the first P-type semiconductor layer.

2. The solid-state image pickup device according to claim 1, wherein the second P-type semiconductor layers are formed under the element isolation regions.

3. The solid-state image pickup device according to claim 1, wherein the second P-type semiconductor layers and the first P-type semiconductor layer function as barrier layers which electrically isolate the optical/electrical conversion portions from each other.

4. The solid-state image pickup device according to claim 1, wherein the second P-type semiconductor layers further include second P-type semiconductor layers which are provided to extend from the surface portion of the first N-type semiconductor layer to the surface portion of the first P-type semiconductor layer along chip cut portions for use in cutting the semiconductor substrate into a plurality of chips.

5. The solid-state image pickup device according to claim 1, wherein
   the P-type impurities contained in the semiconductor substrate and the first P-type semiconductor layer are boron (B);
   the boron (B) is thermally diffused from the P-type semiconductor layer to form the first P-type semiconductor layer;
   the first N-type semiconductor layer is an epitaxial layer containing phosphorus (P) as the N-type impurities; and
   the second P-type semiconductor layer is formed of boron (B) ion-implanted thereinto.

6. The solid-state image pickup device according to claim 1, wherein
   the optical/electrical conversion portions and portions of the first N-type semiconductor layer which surround the optical/electrical conversion portions are surrounded by the second P-type semiconductor layers as viewed from above; and
   bottoms of the portions of the first N-type semiconductor layer which surround the optical/electrical conversion portions are covered by the first P-type semiconductor layer, and the portions of the first N-type semiconductor layers are isolated from each other.

7. The solid-state image pickup device according to claim 1, wherein the concentration of P-type impurities contained in a center portion of each of the second P-type semiconductor layers is higher than that of P-type impurities contained in a peripheral portion of said each second P-type semiconductor layer.

8. The solid-state image pickup device according to claim 1, further comprising;
   read transistors which are provided in the surface portion of the first N-type semiconductor layer and in the vicinity of the optical/electrical conversion portions, and wherein the second P-type semiconductor layers are provided to continuously extend from lower sides of drains of the read transistors to the surface portion of the first P-type semiconductor layer.

9. The solid-state image pickup device according to claim 1, further comprising;
   a reset transistor, an amplification transistor, an address transistor and a diode.

10. A solid-state image pickup device comprising:
    a semiconductor substrate which comprises a substrate body containing P-type impurities and a first N-type semiconductor layer containing N-type impurities, the first N-type semiconductor layer being provided on the substrate body, and including a first P-type semiconductor layer which contains p-type impurities, and which is located on the substrate body;
    a plurality of optical/electrical conversion portions formed of second N-type semiconductor layers which are provided independently of each other in respective positions in a surface portion of the first N-type semiconductor layer; and
    a plurality of second P-type semiconductor layers which are formed to surround the optical/electrical conversion portions, which are provided along element isolation regions provided in respective positions in the surface portion of the first N-type semiconductor layer, and which continuously extend from the surface portion of the first N-type semiconductor layer to a surface portion of the first P-type semiconductor layer,
wherein the concentration of P-type impurities contained in a center portion of each of the second P-type semiconductor layers is higher than that of P-type impurities contained in a peripheral portion of said each second P-type semiconductor layer.

11. The solid-state image pickup device according to claim 10, wherein the second P-type semiconductor layers are formed under the element isolation regions.

12. The solid-state image pickup device according to claim 10, wherein the second P-type semiconductor layers and the first P-type semiconductor layer function as barrier layers which electrically isolate the optical/electrical conversion portions from each other.

13. The solid-state image pickup device according to claim 10, wherein the second P-type semiconductor layers further include second P-type semiconductor layers which are provided to extend from the surface portion of the first N-type semiconductor layer to the surface portion of the first P-type semiconductor layer along chip cut portions for use in cutting the semiconductor substrate into a plurality of chips.

14. The solid-state image pickup device according to claim 10, wherein the P-type impurities contained in the semiconductor substrate and the first P-type semiconductor layer are boron (B);
the boron (B) is thermally diffused from the P-type semiconductor layer to form the first P-type semiconductor layer;
the first N-type semiconductor layer is an epitaxial layer containing phosphorus (P) as the N-type impurities; and
the second P-type semiconductor layer is formed of boron (B) ion-implanted thereinto.

15. The solid-state image pickup device according to claim 10, wherein
the optical/electrical conversion portions and portions of the first N-type semiconductor layer which surround the optical/electrical conversion portions are surrounded by the second P-type semiconductor layers as viewed from above; and
bottoms of the portions of the first N-type semiconductor layer which surround the optical/electrical conversion portions are covered by the first P-type semiconductor layer, and the portions of the first N-type semiconductor layers are isolated from each other.

16. The solid-state image pickup device according to claim 10, further comprising;
read transistors which are provided in the surface portion of the first N-type semiconductor layer and in the vicinity of the optical/electrical conversion portions, and wherein the second P-type semiconductor layers are provided to continuously extend from lower sides of drains of the read transistors to the surface portion of the first P-type semiconductor layer.

17. The solid-state image pickup device according to claim 10, further comprising;
a reset transistor, an amplification transistor, an address transistor and a diode.

* * * * *